(12) United States Patent
Wu

(10) Patent No.: US 11,830,279 B2
(45) Date of Patent: Nov. 28, 2023

(54) SCREEN FINGERPRINT COMPONENT AND TERMINAL DEVICE

(71) Applicant: VIVO MOBILE COMMUNICATION CO., LTD., Guangdong (CN)

(72) Inventor: Huaping Wu, Chang'an Dongguan (CN)

(73) Assignee: VIVO MOBILE COMMUNICATION CO., LTD., Chang'an Dongguan (CN)

( * ) Notice: Subject to any disclaimer, the term of this patent is extended or adjusted under 35 U.S.C. 154(b) by 106 days.

(21) Appl. No.: 17/535,003

(22) Filed: Nov. 24, 2021

(65) Prior Publication Data

US 2022/0084318 A1 Mar. 17, 2022

Related U.S. Application Data

(63) Continuation of application No. PCT/CN2020/080250, filed on Mar. 19, 2020.

(30) Foreign Application Priority Data

May 29, 2019 (CN) .......................... 201910456598.8

(51) Int. Cl.
*G06V 40/13* (2022.01)
*H05K 5/00* (2006.01)
*H05K 5/03* (2006.01)

(52) U.S. Cl.
CPC ....... *G06V 40/1318* (2022.01); *H05K 5/0017* (2013.01); *H05K 5/03* (2013.01)

(58) Field of Classification Search
None
See application file for complete search history.

(56) References Cited

U.S. PATENT DOCUMENTS

2015/0034811 A1* 2/2015 David .................. G06F 3/0421
385/15
2017/0228579 A1 8/2017 Zhu et al.
2017/0372114 A1* 12/2017 Cho .................. G06V 40/1318
(Continued)

FOREIGN PATENT DOCUMENTS

CN 104680162 A 6/2015
CN 107004118 A 8/2017
(Continued)

OTHER PUBLICATIONS

Chinese Search Report dated Sep. 11, 2020 as received in application No. 201910456598.8.
(Continued)

*Primary Examiner* — Joseph R Haley
(74) *Attorney, Agent, or Firm* — Maschoff Brennan

(57) ABSTRACT

The present disclosure provides a screen fingerprint component and a terminal device. The screen fingerprint component includes: a first glass cover plate, a display module, a strobe light, and a fingerprint module, where the first glass cover plate, the display module, and the fingerprint module are stacked, a first side of the display module is attached to a first surface of the first glass cover plate, the strobe light is located on one side of the first glass cover plate and adjacent to both the first surface of the first glass cover plate and the first side of the display module, and the strobe light faces the first glass cover plate.

18 Claims, 3 Drawing Sheets

(56) References Cited

U.S. PATENT DOCUMENTS

2018/0041672 A1* 2/2018 Yu .................. G02B 6/0055
2019/0156096 A1* 5/2019 Lin .................. G06V 40/1318
2020/0279091 A1* 9/2020 Wang ................ H10K 59/12

FOREIGN PATENT DOCUMENTS

| | | |
|---|---|---|
| CN | 207250519 U | 4/2018 |
| CN | 207601821 U | 7/2018 |
| CN | 109190465 A | 1/2019 |
| CN | 109376570 A | 2/2019 |
| CN | 109564628 A | 4/2019 |
| CN | 109564630 A | 4/2019 |
| CN | 109803078 A | 5/2019 |
| CN | 110222618 A | 9/2019 |
| TW | I637324 B | 10/2018 |

OTHER PUBLICATIONS

International Search Report and Written Opinion dated Dec. 9, 2021 as received in application No. PCT/CN2020/080250.
Extended European Search Report dated Jun. 24, 2022 as received in Application No. 20813992.3.

* cited by examiner

SCREEN FINGERPRINT COMPONENT AND TERMINAL DEVICE

CROSS REFERENCE TO RELATED APPLICATIONS

This application is a continuation application of PCT Application No. PCT/CN2020/080250 filed on Mar. 19, 2020, which claims priority to Chinese Patent Application No. 201910456598.8, filed in China on May 29, 2019, disclosures of which are incorporated herein by reference in their entireties.

TECHNICAL FIELD

The present disclosure relates to the field of communications technologies, and in particular, to a screen fingerprint component and a terminal device.

BACKGROUND

With rapid development of terminal devices, disposing a fingerprint module below a display module has become a current mainstream design solution. In actual application, a strobe light is usually located below the display module and on one side of the fingerprint module. Currently, when the strobe light is used for light supplement, infrared light emitted from the strobe light needs to sequentially pass through a backlight layer, the display module, and a glass cover plate, so as to complete light supplement for a fingerprint. It can be learned that, because the infrared light passes through too many structures, attenuation of the infrared light is relatively large, resulting in a relatively poor light supplement effect of the infrared light.

SUMMARY

According to a first aspect, an embodiment of the present disclosure provides a screen fingerprint component, including: a first glass cover plate, a display module, a strobe light, and a fingerprint module, where the first glass cover plate, the display module, and the fingerprint module are stacked, a first side of the display module is attached to a first surface of the first glass cover plate, the strobe light is located on one side of the first glass cover plate and adjacent to the first surface of the first glass cover plate and the first side of the display module, and the strobe light faces the first glass cover plate.

According to a second aspect, an embodiment of the present disclosure further provides a terminal device, including the foregoing screen fingerprint component.

BRIEF DESCRIPTION OF DRAWINGS

To describe the technical solutions in embodiments of the present disclosure more clearly, the following briefly describes the accompanying drawings required for describing the embodiments of the present disclosure. Apparently, the accompanying drawings in the following description show merely some embodiments of the present disclosure, and a person of ordinary skill in the art may still derive other drawings from these accompanying drawings.

DESCRIPTION OF EMBODIMENTS

The technical solutions in the embodiments of the present disclosure are described below clearly and completely with reference to the accompanying drawings in the embodiments of the present disclosure. Apparently, the described embodiments are some rather than all of the embodiments of the present disclosure. All other embodiments obtained by a person of ordinary skill in the art based on the embodiments of the present disclosure shall fall within the protection scope of the present disclosure.

Figure 1:
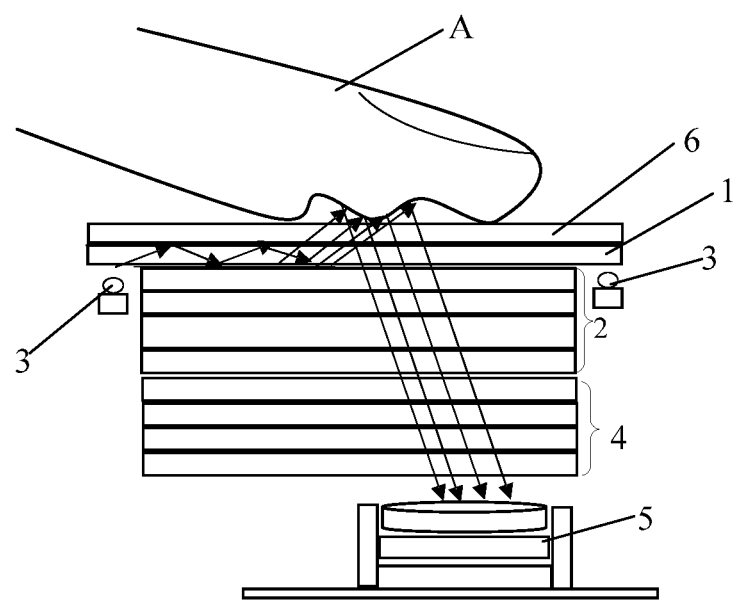
FIG. 1 is a schematic structural diagram of a screen fingerprint component according to an embodiment of the present disclosure.

Referring to FIG. 1, an embodiment of the present disclosure provides a screen fingerprint component, including: a first glass cover plate 1, a display module 2, a strobe light 3, and a fingerprint module 5, where the first glass cover plate 1, the display module 2, and the fingerprint module 5 are stacked, a first side of the display module 2 is attached to a first surface of the first glass cover plate 1, the strobe light 3 is located on one side of the first glass cover plate 1 and adjacent to both the first surface of the first glass cover plate 1 and the first side of the display module 2, and the strobe light 3 faces the first glass cover plate 1.

The screen fingerprint component may further include a backlight layer 4. The backlight layer 4 and the display module 2 may be stacked, to provide a backlight source for the display module 2. The backlight layer 4 includes a brightness enhancement film, a diffusion film, a light guide plate, a reflective film, and the like that are sequentially stacked. The display module 2 may include an upper polarizing film, a color filter, a substrate, a lower polarizing film, and the like that are sequentially stacked, the upper polarizing film may be attached to the first surface of the first glass cover plate 1, and the lower polarizing film may be attached to the brightness enhancement film in the backlight layer 4.

In addition, the fingerprint module 5 may be disposed in a manner of being attached to the backlight layer 4. The fingerprint module 5 may include a lens, a visible light filter, and a fingerprint sensor that are sequentially disposed. However, the fingerprint module 5 may be disposed on a flexible printed circuit board.

For a working principle of this embodiment of the present disclosure, refer to the following descriptions: When there is a fingerprint (denoted by A in FIG. 1) on the first glass cover plate 1, infrared light emitted from the strobe light 3 may irradiate the fingerprint after penetrating the first glass cover plate 1. However, after the infrared light reaches the fingerprint, infrared light that is reflected back into the first glass cover plate 1 may enter the lens of the fingerprint module 5 after sequentially passing through the display module 2 and the backlight layer 4, and finally enters the fingerprint sensor. The fingerprint sensor converts an infrared light signal into an electric signal, then performs data conversion on the electric signal by using an analog-digital converter, and finally generates a fingerprint image. In addition, because intensities of the infrared light reflected at different positions in the fingerprint are inconsistent, gray scales corresponding to different positions in the fingerprint image are different.

In this embodiment of the present disclosure, because the strobe light 3 is located on one side of the first glass cover plate 1 and adjacent to the first surface of the first glass cover plate 1 and the first side of the display module 2, the infrared light emitted from the strobe light 3 needs to pass through only the first glass cover plate 1, to complete light supplement, which reduces attenuation of the infrared light, thereby improving a light supplement effect of the infrared light.

Figure 2:
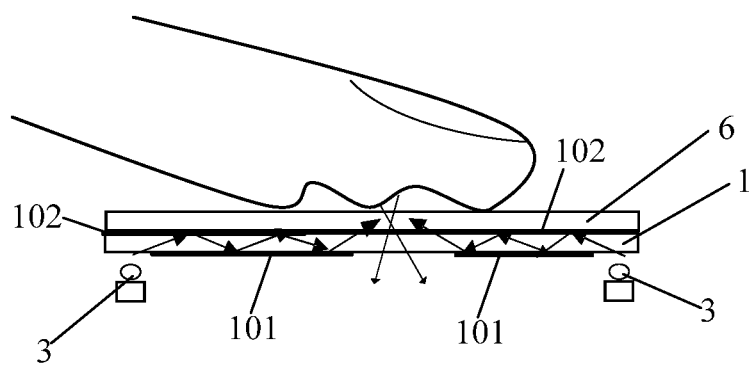
FIG. 2 is a schematic structural diagram of another screen fingerprint component according to an embodiment of the present disclosure.

Optionally, referring to FIG. 2, a first area on the first surface of the first glass cover plate 1 is provided with a first reflective coating 101, a second area on a second surface of the first glass cover plate 1 is provided with a second reflective coating 102, and the first surface and the second surface are oppositely disposed.

The first area and the second area may be opposite each other. Certainly, the first area and the second area may alternatively be staggered with each other. For example, a vertical projection of the first area on the second surface partially coincides with the second area.

Both the first reflective coating 101 and the second reflective coating 102 may allow visible light to pass through. In other words, when the visible light is perpendicularly incident on the first glass cover plate 1, the first reflective coating 101 and the second reflective coating 102 do not affect transmittance of the visible light or a transmission optical path of the visible light. Therefore, the first reflective coating 101 and the second reflective coating 102 do not affect a display effect of the display module 2. However, the first reflective coating 101 and the second reflective coating 102 have low transparency for infrared light. Therefore, when infrared light is transmitted in the first glass cover plate 1, a total reflection effect of the infrared light between the first reflective coating 101 and the second reflective coating 102 is enhanced.

The first reflective coating 101 and the second reflective coating 102 may be made of a material that is similar to or the same as a material of an infrared cut-off filter, and thicknesses of the first reflective coating 101 and the second reflective coating 102 are not limited herein. For example, electron-evaporated titanium dioxide (TiO2) and silicon dioxide (SiO2) films may be used for ion film plating, and central frequency points of the obtained plating films for spectral transmittance are adjusted, to enable central frequency points at which transmittance is the highest to be located in a visible light band. In this way, the finally obtained plating films can be respectively used as the first reflective coating 101 and the second reflective coating 102. In this way, an effect that the first reflective coating 101 and the second reflective coating 102 can both allow visible light to pass through, but have low transmittance for the infrared light can be achieved.

In this embodiment of the present disclosure, because the first reflective coating 101 and the second reflective coating 102 are disposed on the first glass cover plate 1, and transmittance of infrared light on the first reflective coating 101 and the second reflective coating 102 is relatively low, the infrared light can be reflected between the first reflective coating 101 and the second reflective coating 102, and is finally emitted out of the first glass cover plate 1 from a position where the first reflective coating 101 and the second reflective coating 102 are not provided and incident on the fingerprint, to complete light supplement for the fingerprint. In this way, because the first reflective coating 101 and the second reflective coating 102 are disposed in the first glass cover plate 1, an amount of infrared light directly penetrating the first glass cover plate 1 is reduced (that is, loss of the infrared light is reduced), thereby improving a light supplement effect on the fingerprint.

Optionally, an area, corresponding to the strobe light 3, on the first surface of the first glass cover plate 1 is not provided with the first reflective coating 101, and an area, corresponding to the strobe light 3, on the second surface of the first glass cover plate 1 is provided with the second reflective coating 102.

In this implementation, optionally, both the first reflective coating 101 and the second reflective coating 102 are made of a material whose transmittance for infrared light is approximately 0 and whose transmittance for visible light is approximately 100%.

In this embodiment of the present disclosure, the area, corresponding to the strobe light 3, on the first surface of the first glass cover plate 1 is not provided with the first reflective coating 101, which reduces a phenomenon that when infrared light is emitted from the strobe light 3 into the first glass cover plate 1, less infrared light penetrates the first reflective coating 101, that is, an amount of infrared light emitted into the first glass cover plate 1 is increased, thereby enhancing a light supplement effect on the fingerprint. In addition, the area, corresponding to the strobe light 3, on the second surface of the first glass cover plate 1 is provided with the second reflective coating 102, which reduces a phenomenon that the infrared light is directly emitted out of the first glass cover plate 1 from the area, corresponding to the strobe light 3, on the second surface of the first glass cover plate 1, that is, an amount of infrared light entering the first glass cover plate 1 is increased, thereby improving a light supplement effect on the fingerprint.

Optionally, a size of the first reflective coating 101 in a length direction of the first glass cover plate 1 is greater than or equal to that of the second reflective coating 102 in the length direction of the first glass cover plate 1.

Shapes of the first reflective coating 101 and the second reflective coating 102 are not limited herein. For example, both the first reflective coating 101 and the second reflective coating 102 may be in a shape of a rectangle, an oval, or the like. When both the first reflective coating 101 and the second reflective coating 102 may be in a shape of a rectangle, the sizes of the first reflective coating 101 and the second reflective coating 102 in the length direction of the first glass cover plate 1 may be respectively equal to a length of a long side of the rectangle corresponding to the first reflective coating 101 and a length of a long side of the rectangle corresponding to the second reflective coating 102; and when both the first reflective coating 101 and the second reflective coating 102 may be in a shape of an oval, the sizes of the first reflective coating 101 and the second reflective coating 102 in the length direction of the first glass cover plate 1 may be respectively equal to lengths of long axes of the first reflective coating 101 and the second reflective coating 102.

Figure 3:
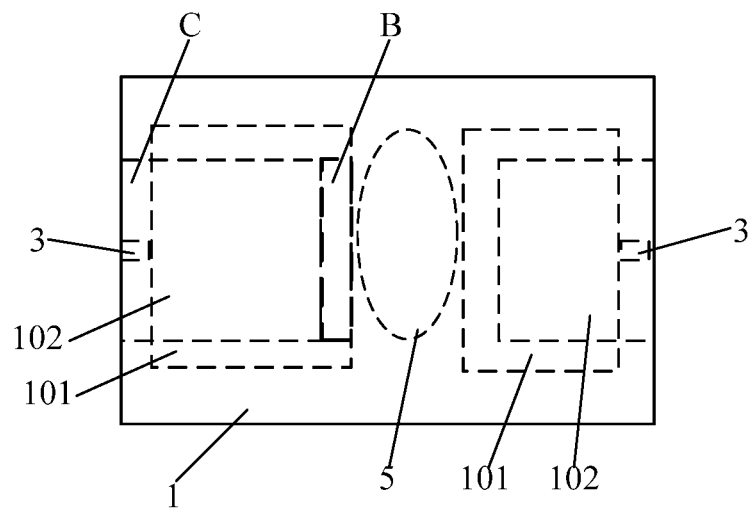
FIG. 3 is a top view of another screen fingerprint component according to an embodiment of the present disclosure.

For example, referring to FIG. 3, when the first reflective coating 101 and the second reflective coating 102 are staggered with each other, one surface, close to the strobe light 3, of the first glass cover plate 1 is not provided with the first reflective coating 101 at a position corresponding to the strobe light 3, and one surface, far away from the strobe light 3, of the first glass cover plate 1 is provided with the second reflective coating 102 at a position corresponding to the strobe light 3, if a width of an area denoted by B is equal to that of an area denoted by C in FIG. 3, the width of the first reflective coating 101 in the length direction of the first glass cover plate 1 is equal to that of the second reflective coating 102 in the length direction of the first glass cover plate 1; or if the width of the area denoted by B is greater than that of the area denoted by C, the width of the first reflective coating 101 in the length direction of the first glass cover plate 1 is greater than that of the second reflective coating 102 in the length direction of the first glass cover plate 1.

In this embodiment of the present disclosure, because the size of the first reflective coating 101 in the length direction of the first glass cover plate 1 is greater than or equal to that of the second reflective coating 102 in the length direction of the first glass cover plate 1, it can be ensured that the infrared light is finally reflected by the first reflective coating 101 and irradiates the fingerprint after penetrating the first glass cover plate 1, to complete light supplement for the fingerprint.

Optionally, a size of the first reflective coating 101 in a width direction of the first glass cover plate 1 is greater than or equal to that of the second reflective coating 102 in the width direction of the first glass cover plate 1.

For example, the size of the first reflective coating 101 in the width direction of the first glass cover plate 1 may be equal to a width of the first glass cover plate 1, but the size of the second reflective coating 102 in the width direction of the first glass cover plate 1 may be less than or equal to the width of the first glass cover plate 1.

In this embodiment of the present disclosure, the size of the first reflective coating 101 in the width direction of the first glass cover plate 1 is greater than or equal to that of the second reflective coating 102 in the width direction of the first glass cover plate 1, so that when infrared light irradiates the first reflective coating 101, an amount of infrared light penetrating the first glass cover plate 1 from a position, where the first reflective coating 101 is not provided, on the first glass cover plate 1 can be reduced, and an amount of infrared light transmitted in the first glass cover plate 1 can be correspondingly increased, thereby improving the light supplement effect of the infrared light on the fingerprint.

Optionally, a vertical projection area of the fingerprint module 5 on the first glass cover plate 1 is not provided with the first reflective coating 101 or the second reflective coating 102.

The vertical projection area of the fingerprint module 5 on the first glass cover plate 1 is not provided with the first reflective coating 101 or the second reflective coating 102, and an image may be displayed in a highlighted manner on the display module 2 at a position corresponding to the fingerprint module 5, for example, a pattern image of the fingerprint may be displayed on the display module 2 at the position corresponding to the fingerprint module 5. In this way, a user can quickly and accurately press the first glass cover plate 1 at a corresponding position, thereby increasing a rate at which a fingerprint image is generated.

In this embodiment of the present disclosure, because the vertical projection area of the fingerprint module 5 on the first glass cover plate 1 is not provided with the first reflective coating 101 or the second reflective coating 102, infrared light blocked by the first reflective coating 101 and the second reflective coating 102 can be reduced, so that the infrared light can conveniently enter the fingerprint module 5.

Optionally, the strobe light 3 is obliquely disposed relative to a plane where the first glass cover plate 1 is located.

That the strobe light 3 is obliquely disposed relative to the plane where the first glass cover plate 1 is located may be implemented in the following manners:

In an optional implementation, in a case that the strobe light 3 includes a lamp wick, and both the strobe light 3 and the lamp wick have column structures, an axial direction of the strobe light 3 is perpendicular to the plane where the first glass cover plate 1 is located, and there is an inclination angle between the axial direction of the strobe light 3 and that of the lamp wick, that is, the axial direction of the strobe light 3 is not parallel to that of the lamp wick; and in another optional implementation, the axial direction of the strobe light 3 is parallel to that of the lamp wick but not perpendicular to the plane where the first glass cover plate 1 is located, and there is an inclination angle between the axial direction of the strobe light 3 and the plane where the first glass cover plate 1 is located.

The strobe light 3 may emit infrared light to be transmitted in a plurality of directions, but the infrared light is mostly concentrated in the axial direction of the strobe light 3. When the strobe light 3 is obliquely disposed relative to the plane where the first glass cover plate 1 is located, most of the infrared light may obliquely enter the first glass cover plate 1. Because most of the infrared light obliquely enters the first glass cover plate 1, the infrared light can be reflected or refracted in the first glass cover plate 1, and is finally emitted out of the first glass cover plate 1 from a position corresponding to the fingerprint, to supplement the fingerprint with light, thereby improving the light supplement effect on the fingerprint.

Optionally, an inclination angle of the strobe light 3 relative to the plane where the first glass cover plate 1 is located is a first preset angle, an incident angle at which light emitted from the strobe light 3 enters the first glass cover plate 1 is greater than or equal to a second preset angle, and the second preset angle is a total reflection angle.

When the light emitted from the strobe light 3 is infrared light, and an incident angle of the infrared light is greater than or equal to the second preset angle, the infrared light may be totally reflected between an upper surface and a lower surface of the first glass cover plate 1. However, a calculation formula of the second preset angle may be: $C=\arcsin(n_2/n_1)$, where C denotes the second preset angle, $n_1$ denotes a refractive index of an optically denser medium, and $n_2$ denotes a refractive index of an optically rarer medium. Part of the infrared light whose incident angle is smaller than the second preset angle may penetrate the upper surface of the first glass cover plate 1 into an external environment, and the other part of the infrared light may be reflected between the upper surface and the lower surface of the first glass cover plate 1.

When the second reflective coating 102 is disposed on the upper surface of the first glass cover plate 1, and the first reflective coating 101 is disposed on the lower surface of the first glass cover plate 1, the first reflective coating 101 and/or the second reflective coating 102 are/is an optically rarer medium, and the first glass cover plate 1 is an optically denser medium; or the first reflective coating 101 and/or the second reflective coating 102 are/is an optically denser medium, and air outside the reflective coating is an optically rarer medium. It should be noted that, the upper surface of the first glass cover plate 1 is the second surface of the first glass cover plate 1, and the lower surface of the first glass cover plate 1 is the first surface of the first glass cover plate 1.

A determining method of the first preset angle is not limited herein. For example, when an incident angle of more than a certain percentage of the infrared light emitted from the strobe light 3 is greater than or equal to the second preset angle, an inclination angle of the strobe light 3 may be determined as the first preset angle. A specific value of the certain percentage is not limited herein, for example, may be 50%, 55%, 60%, or the like.

Figure 4:
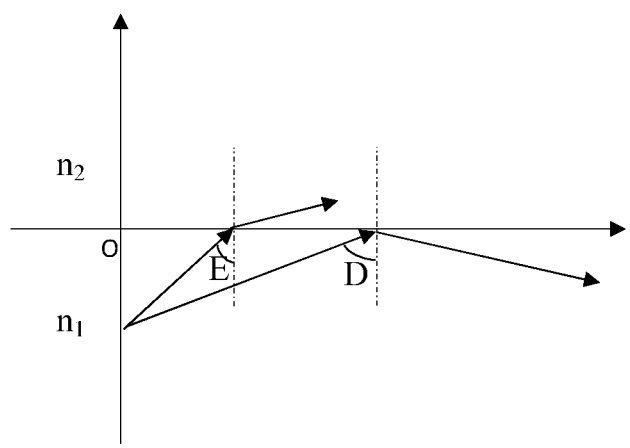
FIG. 4 is a schematic diagram of a ray propagation direction of infrared light according to an embodiment of the present disclosure.

Referring to FIG. 4, an angle D is greater than the second preset angle, and an angle E is smaller than the second preset angle. Infrared light whose incident angle is the angle D may be totally reflected between the upper surface and the lower surface of the first glass cover plate 1, and infrared light whose incident angle is the angle E may penetrate the upper surface of the first glass cover plate 1 into the external environment. In addition, $n_1$ in FIG. 4 denotes a refractive index of an optically denser medium, and $n_2$ denotes a refractive index of an optically rarer medium.

In this embodiment of the present disclosure, because the strobe light 3 is obliquely disposed relative to the plane where the first glass cover plate 1 is located, most of the infrared light may obliquely enter the first glass cover plate 1, thereby increasing an amount of reflected infrared light, and enhancing the light supplement effect. In addition, because an incident angle of the infrared light may be adjusted to be greater than or equal to the second preset angle, the infrared light can be totally reflected between the first reflective coating 101 and the second reflective coating 102, thereby reducing loss of the infrared light, and further improving the light supplement effect on the fingerprint.

Optionally, the screen fingerprint component further includes a second glass cover plate 6, and the second glass cover plate 6 and the first glass cover plate 1 are stacked.

Shapes, sizes, and materials of the first glass cover plate 1 may be the same as those of the second glass cover plate 6.

In this embodiment of the present disclosure, the screen fingerprint component includes the first glass cover plate 1 and the second glass cover plate 6, the second glass cover plate 6 is stacked on the first glass cover plate 1, but the first reflective coating 101 and the second reflective coating 102 are disposed on the first glass cover plate 1. In this way, wear loss of the first reflective coating 101 and the second reflective coating 102 during use can be reduced, thereby prolonging service life of the first reflective coating 101 and the second reflective coating 102. In addition, in this embodiment of the present disclosure, because the first reflective coating 101 and the second reflective coating 102 do not need to be in direct contact with the external environment or a user, process requirements on the first reflective coating 101 and the second reflective coating 102 are lowered, and processing costs are reduced.

Optionally, the display module 2 further includes a second side and a third side that are opposite each other, the second side and the third side are respectively adjacent to the first side, the screen fingerprint component includes two strobe lights 3, and the two strobe lights 3 are respectively adjacent to the second side and the third side.

In this embodiment of the present disclosure, because the two strobe lights 3 are disposed, and the two strobe lights 3 are respectively adjacent to the second side and the third side of the display module 2, a more uniform light supplement effect can be achieved.

Figure 5:
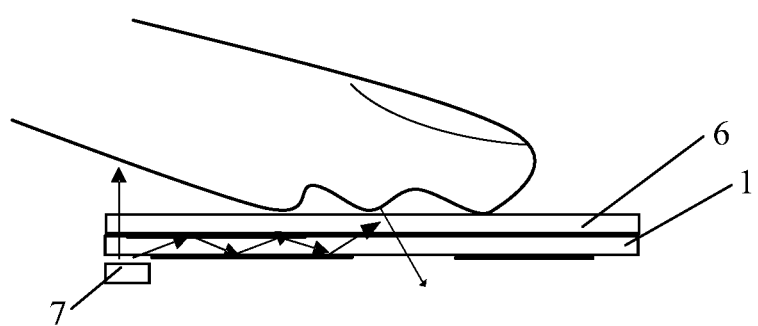
FIG. 5 is a schematic structural diagram of another screen fingerprint component according to an embodiment of the present disclosure.

Optionally, referring to FIG. 5, the screen fingerprint component further includes an infrared photosensor, where the strobe lights 3 are infrared lamps in the infrared photosensor.

In different application scenarios, a luminous intensity and level of the strobe light 3 can be controlled. For example, when the strobe light 3 is used for fingerprint identification, the strobe light 3 can be controlled to be at a high level, and the luminous intensity is relatively high; and when the strobe light 3 is used for proximity detection, the strobe light 3 can be controlled to be at a low level, and the luminous intensity is relatively low. In this way, the luminous intensity of the strobe light 3 can be controlled more flexibly.

In this embodiment of the present disclosure, because the strobe light 3 is the infrared lamp in the infrared photosensor 7, a strobe light and a corresponding drive circuit do not need to be independently disposed, thereby reducing use costs.

It should be noted that, arrows in FIG. 1 to FIG. 5 may represent a propagation direction of the infrared light.

An embodiment of the present disclosure further provides a terminal device, including the foregoing screen fingerprint component. For a specific structure of the screen fingerprint component, refer to the descriptions of the foregoing embodiments of the present disclosure, and details are not described herein. Because the screen fingerprint component in the foregoing embodiments of the present disclosure is used in this embodiment of the present disclosure, a beneficial technical effect the same as that of the foregoing embodiments of the present disclosure can be achieved.

The embodiments of the present disclosure are described above with reference to the accompanying drawings. However, the present disclosure is not limited to the foregoing specific implementations. The foregoing specific implementations are merely exemplary, but are not limiting. Under the enlightenment of the present disclosure, a person of ordinary skill in the art may make many forms without departing from the objective and the scope of the claims of the present disclosure, and all of which fall within the protection of the present disclosure.

What is claimed is:

1. A screen fingerprint component, comprising: a first glass cover plate, a display module, a strobe light, and a fingerprint module, wherein the first glass cover plate, the display module, and the fingerprint module are stacked, a first side of the display module is attached to a first surface of the first glass cover plate, the strobe light is located on one side of the first glass cover plate and adjacent to the first surface of the first glass cover plate and the first side of the display module, and the strobe light faces the first glass cover plate;

wherein a first area on the first surface of the first glass cover plate is provided with a first reflective coating, a second area on a second surface of the first glass cover plate is provided with a second reflective coating, and the first surface and the second surface are oppositely disposed; and wherein an area, corresponding to the strobe light, on the first surface of the first glass cover plate is not provided with the first reflective coating, and an area, corresponding to the strobe light, on the second surface of the first glass cover plate is provided with the second reflective coating.

2. The screen fingerprint component according to claim 1, wherein a size of the first reflective coating in a length direction of the first glass cover plate is greater than or equal to that of the second reflective coating in the length direction of the first glass cover plate.

3. The screen fingerprint component according to claim 1, wherein a size of the first reflective coating in a width direction of the first glass cover plate is greater than or equal to that of the second reflective coating in the width direction of the first glass cover plate.

4. The screen fingerprint component according to claim 1, wherein a vertical projection area of the fingerprint module on the first glass cover plate is not provided with the first reflective coating or the second reflective coating.

5. The screen fingerprint component according to claim 4, wherein the strobe light is obliquely disposed relative to a plane where the first glass cover plate is located.

6. The screen fingerprint component according to claim 5, wherein an inclination angle of the strobe light relative to the plane where the first glass cover plate is located is a first preset angle, an incident angle at which light emitted from the strobe light enters the first glass cover plate is greater than or equal to a second preset angle, and the second preset angle is a total reflection angle.

7. The screen fingerprint component according to claim 1, wherein the screen fingerprint component further comprises a second glass cover plate, and the second glass cover plate and the first glass cover plate are stacked.

8. The screen fingerprint component according to claim 1, wherein the display module further comprises a second side and a third side that are opposite each other, the second side and the third side are respectively adjacent to the first side, the screen fingerprint component comprises two strobe lights, and the two strobe lights are respectively adjacent to the second side and the third side.

9. The screen fingerprint component according to claim 1, further comprising an infrared photosensor, wherein the strobe light is an infrared lamp in the infrared photosensor.

10. A terminal device, comprising a screen fingerprint component, wherein the screen fingerprint component comprises:
a first glass cover plate, a display module, a strobe light, and a fingerprint module, wherein the first glass cover plate, the display module, and the fingerprint module are stacked, a first side of the display module is attached to a first surface of the first glass cover plate, the strobe light is located on one side of the first glass cover plate and adjacent to the first surface of the first glass cover plate and the first side of the display module, and the strobe light faces the first glass cover plate;
wherein a first area on the first surface of the first glass cover plate is provided with a first reflective coating, a second area on a second surface of the first glass cover plate is provided with a second reflective coating, and the first surface and the second surface are oppositely disposed; and
wherein an area, corresponding to the strobe light, on the first surface of the first glass cover plate is not provided with the first reflective coating, and an area, corresponding to the strobe light, on the second surface of the first glass cover plate is provided with the second reflective coating.

11. The terminal device according to claim 10, wherein the display module further comprises a second side and a third side that are opposite each other, the second side and the third side are respectively adjacent to the first side, the screen fingerprint component comprises two strobe lights, and the two strobe lights are respectively adjacent to the second side and the third side.

12. The terminal device according to claim 10, wherein the screen fingerprint component further comprises an infrared photosensor, wherein the strobe light is an infrared lamp in the infrared photosensor.

13. The terminal device according to claim 12, wherein a size of the first reflective coating in a length direction of the first glass cover plate is greater than or equal to that of the second reflective coating in the length direction of the first glass cover plate.

14. The terminal device according to claim 12, wherein a size of the first reflective coating in a width direction of the first glass cover plate is greater than or equal to that of the second reflective coating in the width direction of the first glass cover plate.

15. The terminal device according to claim 11, wherein a vertical projection area of the fingerprint module on the first glass cover plate is not provided with the first reflective coating or the second reflective coating.

16. The terminal device according to claim 15, wherein the strobe light is obliquely disposed relative to a plane where the first glass cover plate is located.

17. The terminal device according to claim 16, wherein an inclination angle of the strobe light relative to the plane where the first glass cover plate is located is a first preset angle, an incident angle at which light emitted from the strobe light enters the first glass cover plate is greater than or equal to a second preset angle, and the second preset angle is a total reflection angle.

18. The terminal device according to claim 11, wherein the screen fingerprint component further comprises a second glass cover plate, and the second glass cover plate and the first glass cover plate are stacked.

* * * * *